United States Patent [19]

Oiwa

[11] 4,000,475
[45] Dec. 28, 1976

[54] AUDIO AMPLIFIER ARRANGEMENT
[75] Inventor: Mitsugu Oiwa, Hamakita, Japan
[73] Assignee: Nippon Gakki Seizo Kabushiki Kaisha, Hamamatsu, Japan
[22] Filed: June 19, 1975
[21] Appl. No.: 588,652
[30] Foreign Application Priority Data
June 21, 1974 Japan .................. 49-72869[U]
[52] U.S. Cl. .................. 330/66; 330/51
[51] Int. Cl.² .................. H03F 1/00
[58] Field of Search .................. 330/51, 65, 66; 325/353; 317/101 CB

[56] References Cited
UNITED STATES PATENTS

| | | | |
|---|---|---|---|
| 2,175,025 | 10/1939 | Hooven | 325/353 |
| 2,486,764 | 11/1949 | Singer | 317/101 CB |
| 2,614,157 | 10/1952 | Montgomery | 330/65 X |
| 2,731,555 | 1/1956 | Beck | 325/353 X |
| 2,895,087 | 7/1959 | Liets et al. | 317/101 CB |
| 3,134,945 | 5/1964 | Wertheimer | 325/353 X |
| 3,466,564 | 9/1969 | Weischeder | 330/66 |
| 3,482,147 | 12/1969 | Kersten | 317/101 CB |
| 3,569,788 | 3/1971 | Niblack | 325/353 X |

Primary Examiner—James B. Mullins
Attorney, Agent, or Firm—Cushman, Darby & Cushman

[57] ABSTRACT

An audio amplifier arrangement comprises an amplifier unit containing an amplifier circuitry, and a manipulation unit, independent of said amplifier unit, having manipulation elements for controlling the operation of the amplifier unit. These two units can be detachably and directly coupled together both electrically and mechanically by terminal connectors and by mechanical locking means provided on these two units for operation as a complete amplifier assembly. These two units, furthermore, are operable also in their separate state or in a "remote-control" mode of operation by electrically coupling said terminal connectors together by the use of a connector-equipped cable means applied between these two units.

14 Claims, 9 Drawing Figures

U.S. Patent   Dec. 28, 1976   4,000,475
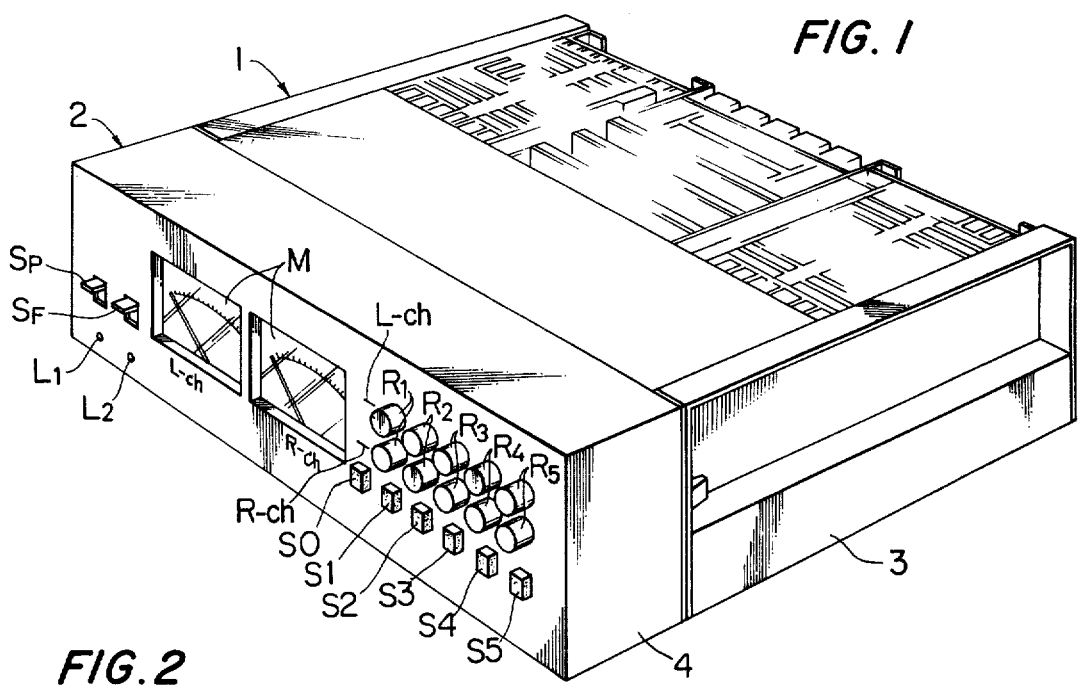
FIG. 1
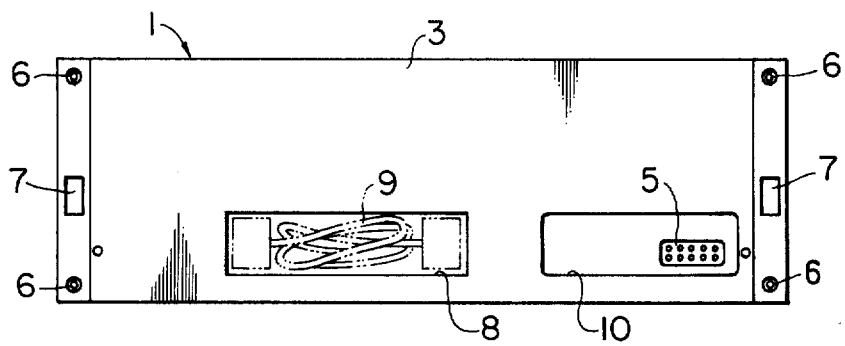
FIG. 2
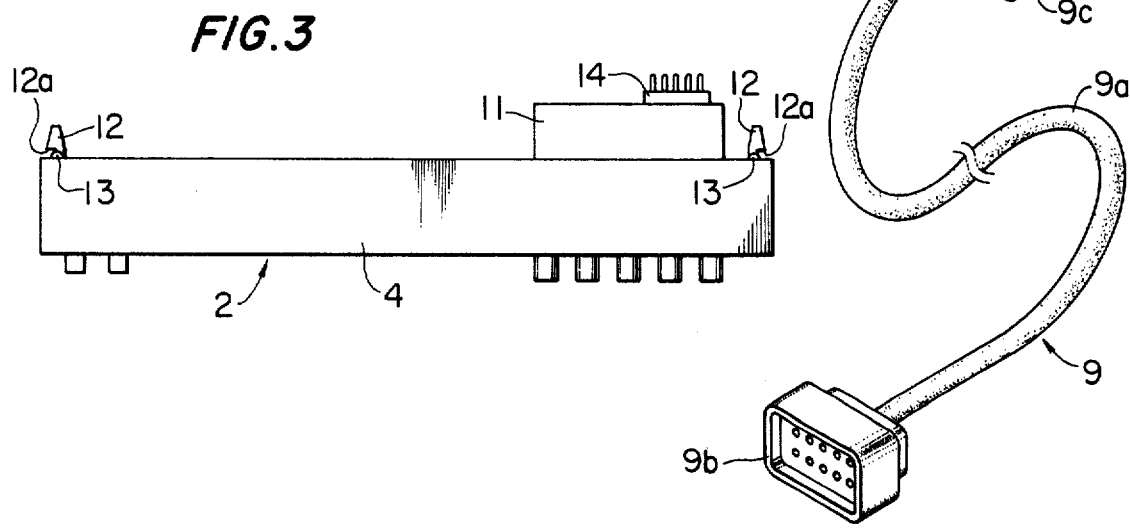
FIG. 3
FIG. 4

AUDIO AMPLIFIER ARRANGEMENT

BACKGROUND OF THE INVENTION

1. Field of the Invention

The present invention is concerned with an audio amplifier arrangement, and more particularly it relates to an audio amplifier arrangement which enables the user to operate the arrangement either directly or in a remote-control mode as desired.

2. Description of the Prior Art

In stereophonic system or like audio systems, those of the so-called component style which are of the arrangement that a record player, an amplifier, speakers and like parts are selected and assembled in accordance with the taste of the user are now being used widely.

It is usual that these component parts are arranged together and that the position at which they are installed is different from the position at which user listens to the sounds produced from the speakers of the assembly. As such, in case the listener intends to adjust the sound volume, sound quality, balance of sounds or like items, the listener has to depart from the optimum position at which he has been listening and to move over to the site at which the assembly is installed to accomplish these purposes, and this is quite inconvenient to the listener. Recently, it is often the case that the user employs a plurality of speakers of different makes so as to switch from one speaker to another so as to select a most suitable speaker for certain kind of music. In view of the fact that these speakers could be different from each other in acoustic pressure, it would be necessary to adjust the loudness level control for the respective speakers. In such a case also, the aforesaid inconvenience arises. Furthermore, when it is intended by the user to confirm the difference in sounds which are produced from these speakers while listening to the sounds, it is important that the listener keeps staying at the optimum position of listening. Such a convenience cannot be expected from the audio systems of the prior art.

Also, indication of output level is carried out frequently on the amplifier, especially on the power amplifier. However, under the circumstance that the assembly is set at a considerable distance from the listener, it is difficult for the user to visually confirm the indications on the indicators provided on the power amplifier at such a distance therefrom.

SUMMARY OF THE INVENTION

It is, therefore, a primary object of the present invention to provide an audio amplifier arrangement which can be controlled directly as well as remotely as desired by a simplified structure.

Another object of the present invention is to provide an audio amplifier arrangement of the type described, which enables the mechanical as well as electrical separation and coupling of the manipulation unit and the amplifier unit to be performed easily and freely.

Still another object of the present invention is to provide an audio amplifier arrangement of the type described, which enables the coupling of the manipulation unit to the amplifier unit in their separate mode to be accomplished by the use of a connector-equipped cable means.

These as well as other objects and the features of the present invention will become apparent by reading the following statement when taken in conjunction with the accompanying drawings.

BRIEF DESCRIPTION OF THE DRAWINGS

The drawings show examples of the audio amplifier arrangement according to the present invention.

FIG. 1 is a perspective view of the audio amplifier arrangement of the present invention in the state that the amplifier unit and the manipulation unit are directly coupled together both electrically and mechanically.

FIG. 2 is an explanatory front elevation of the amplifier unit shown in block style.

FIG. 3 is an explanatory top view of the manipulation unit shown in block style.

FIG. 4 is an explanatory illustration of the connector-equipped cable means.

Like parts are shown by like reference numerals and symbols for the sake of simplicity throughout the drawings.

DETAILED DESCRIPTION OF THE PREFERRED EMBODIMENTS

Figure 5:
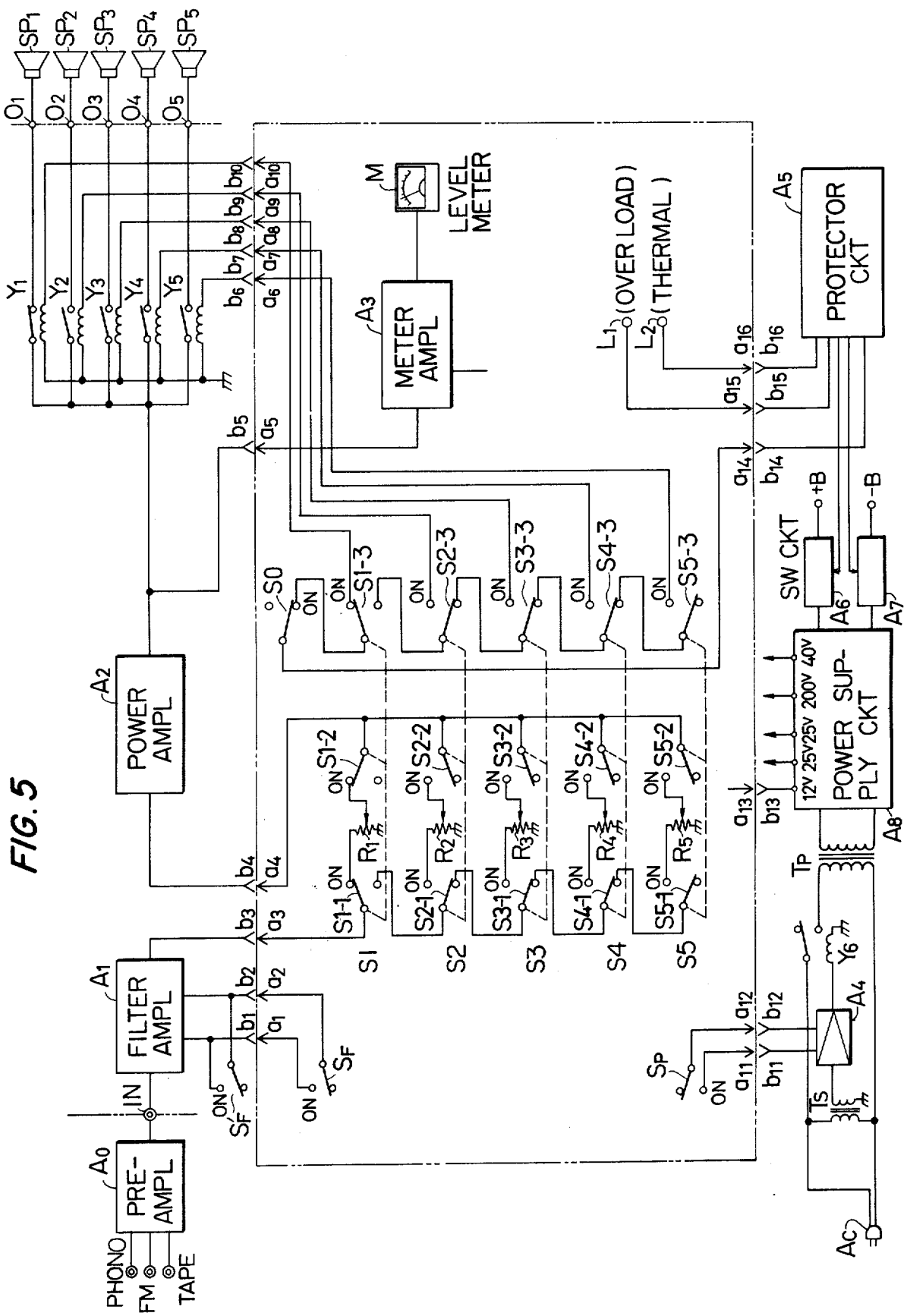
FIG. 5 is a wiring block diagram, showing in general the respective circuits of the amplifier unit and the manipulation unit in their coupled state.

In FIG. 1 which shows an audio amplifier arrangement for two-channel stereophonic sound reproduction embodying one aspect of the present invention, reference numerals 1 and 2 represent an amplifier unit and a manipulation unit, respectively.

A casing 3 of the amplifier unit 1 contains such elements as a transformer, a power amplifier, and other necessary parts for constituting an amplifier circuitry. The general arrangement of the essential parts or elements incorporated in the casing 3 of the amplifier unit 1 corresponds, for example, to the regions locating outside the block of dotted line in FIG. 5.

As shown in FIG. 2, on the front side of the casing 3, there are provided a terminal connector 5, position-determining holes 6 and apertures 7 both of which are used for mechanically coupling the manipulation unit 2 to the amplifier unit 1, a first recess 8 for accommodating a connector-equipped cable means 9 shown in FIG. 4, and a second recess 10 for receiving a protruding connector guide 11 shown in FIG. 3.

On the other hand, a casing 4 of the manipulation unit 2 contains manipulation elements for controlling the operation of the amplifier unit 1. The general arrangement of the essential elements or parts incorporated in the casing 4 of the manipulation unit 2 corresponds, for example, to the region enclosed in the dotted line in FIG. 5. On the front side of the casing 4 of the manipulation unit 2, as shown in FIG. 1, are arranged a power switch $S_P$, a filter switch $S_F$, indicator lamps $L_1$ and $L_2$, output level meters M, speaker selector switches $S_0, S_1, \ldots, S_5$, volume control variable resistors $R_1, \ldots, R_5$ (refer to FIG. 5). And, with reference to FIG. 3, there are provided the protruding connector guide 11 mentioned above, spring-like movable projections 12, position-determining bulgings 13 and a pin-terminal connector 14 on the rear side of the casing 4.

Figure 6:
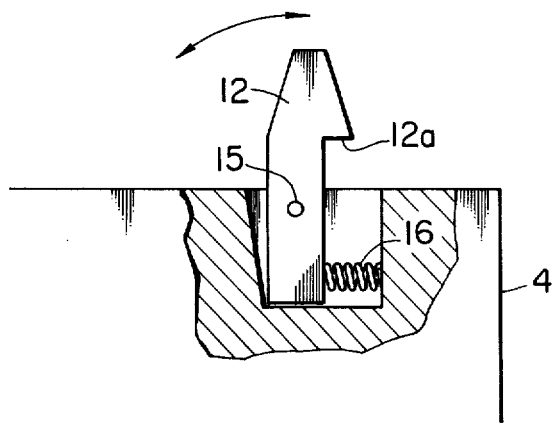
FIG. 6 is an enlarged partial diagrammatic top view of the manipulation unit, showing an example of the movable projection.

The manipulation unit 2 can be detachably directly coupled both mechanically and electrically to the amplifier unit 1, with the rear side of the casing 4 and the front side of the casing 3 abutting each other, as shown in FIG. 1. This coupling and locking is performed by bringing spring-like movable projections 12 of the manipulation unit 2 shown in FIG. 3 into engagement in apertures 7 of the amplifier unit 1 shown in FIG. 2. The movable projections 12 are provided at two corners on the rear surface of the casing 4 which is to abut the front surface of the casing 3 and each is of a generally tapered configuration and has a stepped portion 12a formed intermediate of its length. The projections 12 are urged laterally outwardly in FIG. 3. This urging may be had either by manufacturing the projections 12 with a flexible material such as a plastic material and fixing it at one end to the body of the manipulation unit 1 so as to have a habit of normally tilting laterally outwardly in FIG. 3. Or, the urging may be materialized by the construction shown in FIG. 6. In FIG. 6, the projection 12 of a rigid material is supported rotatably about a pin 15 with one end of the projection 12 protruding out of the manipulation unit 2, and the other end of the projection 12 is pressed by a spring 16 so that the one end of the projection 12 is urged laterally outwardly of the casing 4 of the manipulation unit 2. When this manipulation unit 2 is required to be coupled to the amplifier unit 1, the tips of these projections 12 are advanced progressively into the apertures 7 of the amplifier unit 1 while contacting those walls of the apertures 7 which are positioned closer to the lateral ends of the amplifier unit 1 shown in FIG. 3 and while thereby being pressed inwardly toward each other by said walls. As each projection 12 advances up to a position at which its stepped portion 12a is aligned with the edge of the aperture 7 of the casing 4, the projection 12 is urged laterally outwardly so that its stepped portion 12a will be brought into locking engagement with the edge of the aperture 7. Thus, the casing 4 of the manipulation unit 2 is locked to the amplifier casing 3. However, by this locking alone, there can occur that the terminal connector 5 is not correctly coupled to the pin-terminal 14. In order to avoid this, position-determining means are provided on both the casing 3 of the amplifier unit 1 and the casing 4 of the manipulation unit 2. The position-determining means comprises four bulging 13 which are provided at four corners of that surface of the casing 4 which is to face the front surface of the casing 3, and four bulging-receiving holes 6 which are provided at corresponding positions on that surface of the casing 3 which is to face the rear surface of the casing 4. These position-determining means, as the bulgings 13 are engaged in the bulging-receiving holes 6, serve to inhibit the vertical as well as horizontal play of these two casings 3 and 4 which would occur at the time that they are coupled together. More specifically, by bringing the bulgings 13 into engagement with the bulging-receiving holes 6, the manipulation unit 2 can be securely coupled to the amplifier unit 1. Along with this, the protruding connector guide 11 and the second recess 10 for accommodating the protruding connector guide 11 will both serve as the guiding means for correctly coupling the pin-terminal connector 14 to the terminal connector 5, as will be understood from FIGS. 2 and 3.

When it is intended to remove the amplifier unit 1 off the manipulation unit 2, the projections 12 shown in FIG. 3 are pressed inwardly toward each other by fingers of the user. Whereupon, the stepped portions 12a of these projection 12 will be released from their engagement with the bottom edges of the apertures 7 and the projections 12 will be able to be withdrawn from the casing 3. In this state, the casing 4 of the manipulation unit 2 is pulled toward the user, and this unit will be removed from the casing 3 of the amplifier unit 1. Along with this, the pin-terminal connector 14 of the manipulation unit 2 will be detached from the terminal connector 5 of the amplifier unit 1, and at the same time the bulgings 13 will be disengaged from the bulging-receiving holes 6.

When it is intended to use the amplifier unit 1 and the manipulation unit 2 in their separate state, this desire is satisfied by the use of the cable means which is generally indicated by 9 in FIG. 4. This cable means 9 is composed of a cable 9a having at one end a connector 9b adaptable to the pin-terminal connector 14 and at the other end a connector 9c adaptable to the terminal connector 5. The cable 9a may have a length of, say, five meters as required. Such a length of the cable means does not affect the characteristic of the amplifier 1. The connector 9b of this cable means 9 is coupled to the pin-terminal connector 14 of the manipulation unit 2, whereas the connector 9c is coupled to the terminal connector 5 of the amplifier unit 1, so as to electrically couple two units 1 and 2.

The electrical connection between the amplifier unit 1 and the manipulation unit 2 will hereunder be described by referring to FIG. 5. FIG. 5 shows either of the "left-" and "right-" channel circuits of the stereophonic amplifier arrangement. The region enclosed in the dotted line in FIG. 5 represents the manipulation unit 2. The regions outside the block of the dotted line represent the amplifier unit 1 except for a pre-amplifier $A_0$ and speakers $SP_1, \ldots, SP_5$. Reference symbols $a_1, \ldots, a_{16}$ represent the pin-contacts of the pin-terminal connector 14 and reference symbols $b_1, \ldots, b_{16}$ represent the contacts of the terminal connector 5 to be connected to the corresponding pin-contacts $a_1, \ldots, a_{16}$. The symbol IN represents an input terminal to which an audio input signal is inputted from a signal sources such as a phonograph, an FM radio, or a taperecorder via the pre-amplifier A. The output signal of the pre-amplifier $A_0$ applied to this input terminal IN is fed to a filter amplifier $A_1$ which functions as a rumble filter (low-cut filter). This function as a rumble filter can be attained by turning either the rumble filter switch $S_F$ or $S'_F$ "on".

The filter switch $S_F$ of the rumble filter is provided on the front side of the manipulation unit 2 and the filter switch $S'_F$ (not shown) may be provided at a desired place of the amplifier unit 1, to render the rumble filter element on and off. The output or the input signal as required of the filter amplifier $A_1$ passes through the connector 5 and 14, and via switching circuits, it is applied to a plurality of volume control circuits housed in the manipulation unit 2. The speaker selector switches S1, ..., S5 each has three interlocked contacts S1-1, S1-2, S1-3, ..., S5-1, S5-2, and S5-3. In FIG. 5, the switch SP1 is turned "on". Therefore, the variable resistor $R_1$ is rendered to its operative state by the contact S1-1. The signal which is adjusted of its level by this variable resistor $R_1$ which is shown only by its knob in FIG. 1 passes through the contact S1-2 and therefrom the signal is led via connectors 5 and 14 to the input terminal of the power amplifier $A_2$ contained in the amplifier unit 1, where the signal is power amplified to be derived as an output of the power amplifier $A_2$. Now, the contact S1-3 also is actuated, so that a relay $Y_1$ connected in series between the output terminal of the power amplifier $A_2$ and a first output terminal $O_1$ to which the first speaker $SP_1$ is to be connected is accordingly actuated, thus rendering the circuit of the speaker $SP_1$ "on". Thus, the output of the power amplifier $A_2$ is led to the speaker $SP_1$. The output signal of the power amplifier $A_2$ contained in the amplifier unit 1 is delivered from the output terminal of this power amplifier $A_2$ and, via the connectors 5 and 14, it is led to the input terminal of an output level meter amplifier $A_3$ housed in the manipulation unit 2 where it is amplified. The signal level is then indicated by an output level meter M which is connected to the output terminal of said output level meter amplifier $A_3$.

Description will hereunder be made in connection with the power switch $S_P$ provided in the manipulation unit 2, to the filter amplifier $A_1$, the power amplifier $A_2$, the meter amplifier $A_3$ and the relay circuit in FIG. 5. The $A_C$ supply cord plug $A_C$ is connected to a power source, and the primary of a sub-transformer $T_S$ is connected to the output terminals of said AC supply cord. One line of the secondary of the sub-transformer $T_S$ is grounded, and the other line is connected to the input terminal of a relay actuating circuit $A_4$ of which the output terminal is grounded via the coil of a relay $Y_6$. The control terminals of the relay actuating circuit $A_4$ are connected via connectors 5 and 14 to the power switch $S_P$ housed in the manipulation unit 2.

When the power switch $S_P$ in the manipulation unit 2 is turned "on", a voltage for driving the relay $Y_6$ appears at the output terminal of this relay circuit $A_4$, causing the contact of this relay $Y_6$ to be rendered "on". Whereupon, an AC voltage is supplied to the transformer $T_P$ provided in the power supply section, thus supplying a power to the audio amplifier circuitry.

The manipulation unit 2 is provided with the overload indicator lamp $L_1$ and the thermal indicator lamp $L_2$ as mentioned above. These lamps are connected to the output of a protection circuit $A_5$ so that, in case there develops an overloading in the audio amplifier circuitry particularly in the power amplifier, the overload indicator lamp $L_1$ is lighted up. More specifically, the voltage and the current of the amplifying elements of the audio amplifier circuitry are monitored by the protection circuit $A_5$, and in case there is a disorder therein, the overload indicator lamp $L_1$ is caused to be lighted up for warning by said protection circuit $A_5$. The thermal indicator lamp $L_2$, on the other hand, is connected to the output of the protection circuit $A_5$ so that the temperature of the amplifying elements is monitored thereby. In case a disorder is sensed, the thermal indicator lamp $L_2$ is caused to be lighted up in the same way. At the same time, in order to protect the amplifier circuitry and the speakers $SP_1, \ldots, SP_5$, the protection circuit $A_5$ sends protection signals to protecting switching circuits $A_6$ and $A_7$ provided in the output current paths of a power supply circuit $A_8$ so as to open these output current paths, and ceases the delivery of actuating power for the relays $Y_1, \ldots, Y_5$, resulting in the speakers $SP_1, \ldots, SP_5$ being disconnected from the power amplifier $A_2$.

Description will next be made on the accommodation of the cable means 9. This cable means 9 is not needed in the mode of operation of the audio amplifier assembly in which the manipulation unit 2 is mechanically directly coupled to the amplifier unit 1. In order to accommodate this cable means in the aforesaid mode of operation, there is provided the recess 8 as shown in FIG. 2 in the front surface of the amplifier unit 1. The cable means 9 is accommodated in this recess 8. Thus, in case the amplifier unit 1 is mechanically directly coupled to the manipulation unit 2, the whole assembly will give the appearance as if the two units are formed integrally into one piece apparatus. On the other hand, by placing the manipulation unit 2 at a desired distance from the amplifier unit 1, and by connecting the cable means 9 to each of the two units 1 and 2, it is possible to operate the amplifier unit 1 in the so-called remote control mode at any desired position of the user. Such a mode of operation will be quite convenient for the user who intends to listen to the sounds from one speaker for a certain kind of music and to switch over to another speaker for another kind of music and so on while sitting at the optimum listening position. This arrangement is also convenient for a mode of operation wherein the user installs only speakers in a listening room separate from the room in which the amplifier is installed, since the user can operate the whole assembly while he is sitting at the optimum position in the listening room.

Figure 7:
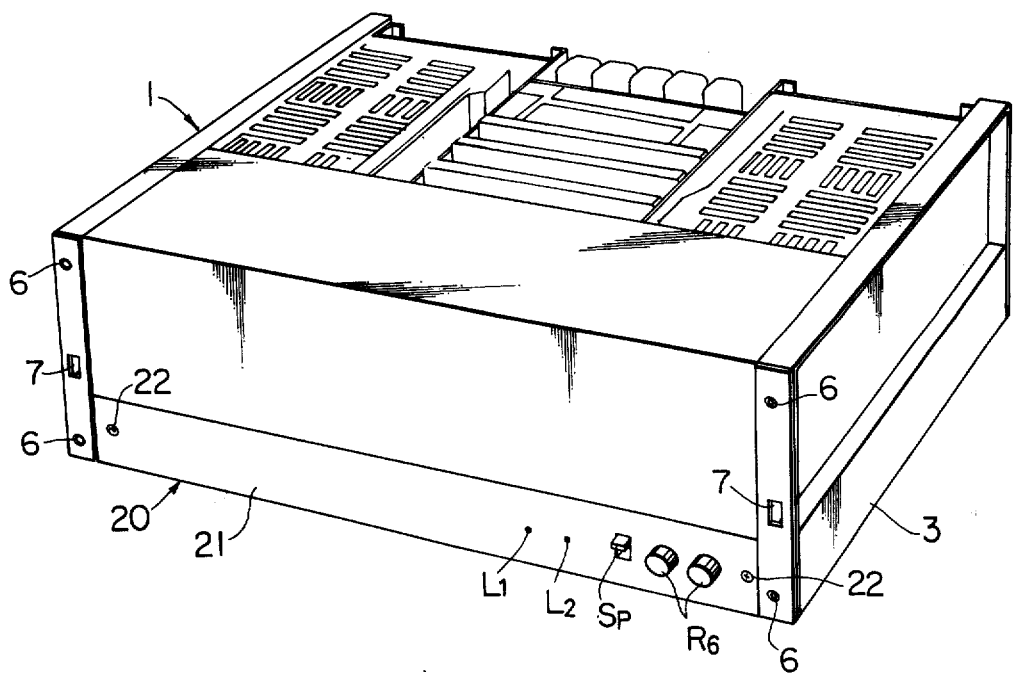
FIG. 7 is a perspective view of the amplifier unit with an adapter unit attached to the front side of this amplifier.
Figure 8:
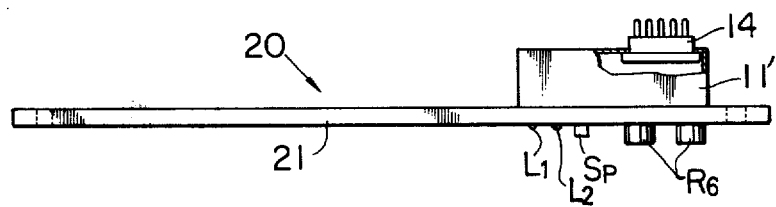
FIG. 8 is an explanatory top view of the adapter unit.
Figure 9:
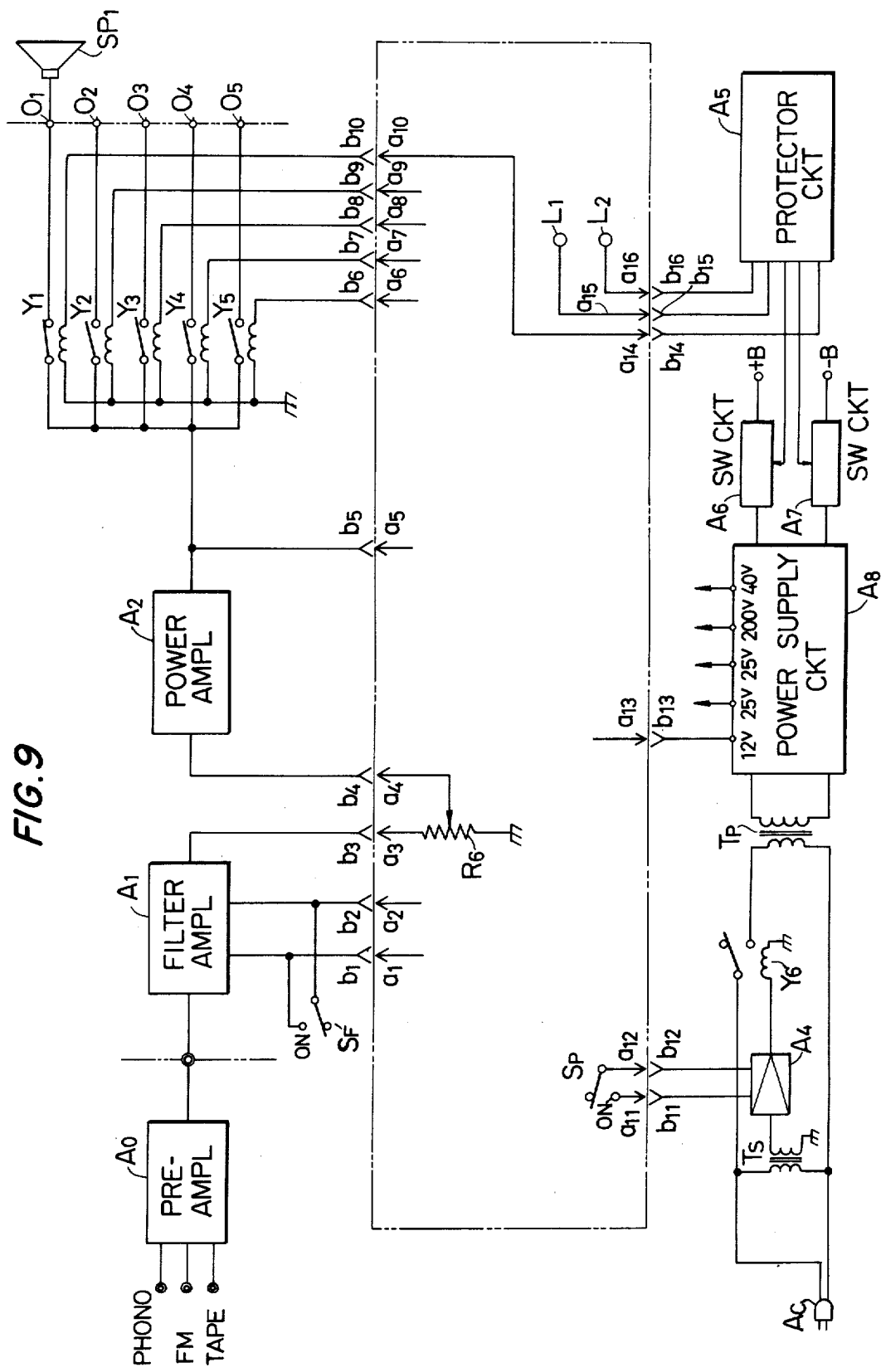
FIG. 9 is a wiring block diagram, showing the respective circuits of the amplifier unit and the adapter unit in their coupled state.

Description will hereunder be made, by referring to FIGS. 7, 8 and 9, on still another aspect of the present invention in which an adapter unit 20 is employed. This adapter unit 20 is intended to be attached to the amplifier unit 1 for permitting the amplifier unit 1 to obtain the necessary least functions of an audio amplifier arrangement without the manipulation unit 2.

This adapter unit 20 is composed, for example, of a panel 21, a pin-terminal connector 14, a protruding connector guide 11' provided on the rear side of this panel 21, and in addition thereto, volume control variable resistors $R_6$, a power switch $S_P$, and indicator lamps $L_1$ and $L_2$ which are contained in the protruding connector guide 11'. The guide 11' is insertable into the second recess 10. On FIGS. 7 and 8, only the knobs of the variable resistors $R_6$ are shown. The adapter unit is attached, by screw 22, to the front surface of the amplifier unit 1 as shown in FIG. 7, and the electrical coupling of these two units 1 and 20 is accomplished by coupling the pin-terminal connector 14 to the terminal connector 5 of the amplifier unit 1.

The electrical connection between the amplifier unit 1 and the adapter unit 20 will hereunder be described by referring to FIG. 9. The region enclosed in the dotted line in FIG. 9 represents the adapter unit 20. The regions outside the block of the dotted line represent the amplifier unit 1 except for the pre-amplifier $A_0$ and speakers $SP_1, \ldots, SP_5$. In this case, the output of the filter amplifier $A_1$ is applied, via the connectors 14 and 15, to the volume control circuit of the variable resistor $R_6$, and without passing through any selecting circuit, this output is applied directly to the input terminal of the power amplifier $A_2$ through the connectors 5 and 14. Out of five relays $Y_1, \ldots, Y_5$, the first relay $Y_1$ only is actuated by the protection circuit $A_5$ so that the output of the power amplifier $A_2$ is fed to the first speaker $SP_1$. Thus, the amplifier unit 1 can perform the necessary least functions of an audio amplifier assembly without the manipulation unit 2.

Description has been made on the present invention with respect to an instance wherein the manipulation section of a power amplifier for changeover of speaker connections is separated from this amplifier. It should be understood, however, that the present invention is applicable equally effectively also to various kinds of manipulation units such as for performing volume control and tone control.

As will be understood clearly from the above statement, the audio amplifier assembly according to the present invention is arranged so that the manipulation unit equipped with various operation elements can be either detachably directly coupled to the amplifier unit both mechanically and electrically, or the manipulation unit can be used separately from the amplifier unit by electrically connecting these two units with a cable means. Thus, only the manipulation unit can be moved to any desired place for a remote control operation. Thus, in the relation with the place of installation of the record player and the speakers, it is possible to freely select the place of installation of the manipulation unit separately from the amplifier unit, which is quite convenient to the user.

It will be understood also that the locking means described above may be replaced by a wellknown hinge means.

I claim:
1. An audio amplifier arrangement comprising:
   an amplifier unit housed in a casing and provided with an amplifier circuitry;
   a manipulation unit housed in a casing and equipped with manipulation elements and fabricated as an independent body separate from said amplifier unit;
   a mechanical coupling means for selectively detachably directly coupling said two units together mechanically; and
   an electrical coupling means for selectively electrically coupling said two units together for amplifying operation
   both when said units are mechanically coupled and when they are mechanically separate, said electrical coupling means comprising electrical members provided at mutually corresponding positions on the respective casings and forming a mating pair and further comprising a cable means having electrical coupling members at each end for mating with said electrical coupling members on said respective casings, the mating pair of coupling members on said casings being mechanically and electrically coupled when said casings are mechanically coupled, and said mating pair of coupling members on said casings being adapted to be electrically coupled through said cable and its electrical coupling means when said units are mechanically separate.

2. An audio amplifier arrangement according to claim 1, in which said amplifier circuitry includes an input terminal, a power amplifier, a plurality of switching elements, and a plurality of output terminals each of which is connected, via said corresponding switching elements, to the output terminal of said power amplifier, and in which said manipulation elements comprise first switches, said input terminal being connected to the input terminal of said power amplifier, and in which said switching elements which connects said plurality of output terminals to the output terminal of said power amplifier are electrically coupled to and controlled by said first switches.

3. An audio amplifier arrangement according to claim 2, said manipulation element further comprising a plurality of variable resistors corresponding to said output terminals, and a plurality of second switches corresponding to said variable resistors for selectively electrically coupling said associated variable resistors between the input terminal and said power amplifier input terminal, said second switches being interlocked correspondingly with said first switches for simultaneous operation therewith,
   whereby selection of a second switch operates the corresponding first switch to couple its associated variable resistor between the input terminal and the power amplifier input terminal so as to adjust the level of an input signal applied thereto.

4. An audio amplifier arrangement according to claim 2, in which a level meter for indicating the output level of said power amplifier of the amplifier unit is provided on the front surface of the manipulation unit.

5. An audio amplifier arrangement according to claim 1, in which said mechanical coupling means is composed of a position-setting means for setting the abutting positions of said two units when these two units are coupled directly together, and a locking means for locking the coupled units together.

6. An audio amplifier arrangement according to claim 5, in which said position-setting means comprises bulgings formed on one of the abutting surfaces of these two units and bulging-receiving holes formed on the other of the abutting surfaces of the two units at positions corresponding to the bulgings.

7. An audio amplifier arrangement according to claim 6, in which the locking means comprises movable tapered members having a spring-like action and extending from bilateral sides of the manipulation unit casing and having engaging portions, and apertures formed through the bilateral sides of the amplifier unit casing for allowing the passage therethrough of the spring-like tapered movable members and having edges for engagement with the engaging portions of the manipulation unit.

8. An audio amplifier arrangement according to claim 7, in which said movable tapered spring-like members are made of a flexible material and fixed at its one end to the casing of one of the two units to be normally urged laterally outwardly of the casing of said one of the two units.

9. An audio amplifier arrangement according to claim 7, in which said tapered movable spring-like members are made of a rigid material and attached movably to the casing of one of the two units and urged by spring means laterally outwardly of the casing of said one of the two units.

10. An audio amplifier arrangement according to claim 1, in which said electrical coupling members forming a mating pair are composed of a pin-terminal connector and a terminal connector,
    said pin-terminal connector being provided on one of the abutting surfaces of said two units,
    said terminal connector being provided on the other of the abutting surfaces of said two units at position corresponding to the position of said pin-terminal connector, so that these two connectors are coupled to each other.

11. An audio amplifier arrangement according to claim 1, in which said electrical coupling members forming a mating pair are composed of a pin-terminal connector and a terminal connector, said pin-terminal connector being provided on a protruding connector guide member protruding from that surface of said manipulation unit which is to abut the abutting surface of said amplifier unit when these units are directly coupled together, said terminal connector being provided within a recess formed on the abutting surface of the amplifier unit, which recess corresponding in position and shape to said protruding connector guide member to receive therein this guide member, thereby receiving the pins of said pin-terminal connector into said terminal connector.

12. An audio amplifier arrangement according to claim 10, in which said electrical coupling members of said cable means comprises a pin-terminal connector provided at one end of said cable means adapted to be inserted into said terminal connector, and a terminal connector provided at the other end of said cable means and adapted to be coupled to said pin-terminal connector.

13. An audio amplifier arrangement according to claim 1, in which said amplifier unit has a recess for accommodating said cable means.

14. An audio amplifier arrangement comprising:

an amplifier unit housed in a casing and containing an input terminal to which an input signal is applied, a power amplifier, an output terminal through which an output of this power amplifier is derived, and a power supply source for supplying the operating power to the power amplifier;

an adapter unit for being attached to said amplifier unit and fabricated as an independent body separate from said amplifier unit and including at least a variable resistor and a power switch;

an electrical coupling means provided on said adapter unit and said amplifier unit for directly coupling the two units electrically together, and fastening means for directly coupling the two units mechanically together, said input signal being led to an input terminal of said power amplifier after being adjusted of its level through said variable resistors, said power supply source being turned "on" and "off" said power switch.

* * * * *